(12) United States Patent
Chen et al.

(10) Patent No.: US 9,741,919 B2
(45) Date of Patent: Aug. 22, 2017

(54) NANO-SCALE SUPERCONDUCTING QUANTUM INTERFERENCE DEVICE AND MANUFACTURING METHOD THEREOF

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Lei Chen, Shanghai (CN); Zhen Wang, Shanghai (CN)

(73) Assignee: SHANGHAI INSTITUTE OF MICROSYSTEM AND INFORMATION TECHNOLOGY, CHINESE ACADEMY OF SCIENCE, Changning District, Shanghai (CN)

( * ) Notice: Subject to any disclaimer, the term of this patent is extended or adjusted under 35 U.S.C. 154(b) by 0 days.

(21) Appl. No.: 15/124,668

(22) PCT Filed: Apr. 8, 2014

(86) PCT No.: PCT/CN2014/074880
§ 371 (c)(1),
(2) Date: Sep. 8, 2016

(87) PCT Pub. No.: WO2015/109663
PCT Pub. Date: Jul. 30, 2015

(65) Prior Publication Data
US 2017/0084814 A1     Mar. 23, 2017

(30) Foreign Application Priority Data

Jan. 24, 2014   (CN) .......................... 2014 1 0035658

(51) Int. Cl.
H01L 39/22       (2006.01)
H01L 39/24       (2006.01)
H01L 29/06       (2006.01)

(52) U.S. Cl.
CPC ........ *H01L 39/223* (2013.01); *H01L 29/0676* (2013.01); *H01L 39/2406* (2013.01); *H01L 39/2416* (2013.01); *H01L 39/2493* (2013.01)

(58) Field of Classification Search
CPC .............. H01L 39/223; H01L 29/0676; H01L 39/2406; H01L 39/2493
See application file for complete search history.

(56) References Cited

U.S. PATENT DOCUMENTS 5,318,950 A     6/1994 Etrillard
5,750,474 A *   5/1998 Sung .................. H01L 39/2496
                                                    427/62

(Continued)

FOREIGN PATENT DOCUMENTS

TW         200428475 A    12/2004

*Primary Examiner* — Jose R Diaz
(74) *Attorney, Agent, or Firm* — Global IP Services; Tianhua Gu

(57) ABSTRACT

A nano-scale superconducting quantum interference device and a manufacturing method thereof, comprising the following steps of: S1: providing a substrate and growing a first superconducting material layer thereon; S2: forming a photo-resist layer and performing patterning; S3: etching the first superconducting material layer in a predetermined region; S4: covering a layer of insulation material on a top and a side of a structure obtained in step S3; S5: growing a second superconducting material layer; S6: removing the structure above the plane where the upper surface of the first superconducting material layer locates, to obtain a plane superconducting structure, in the middle of which at least one insulating interlayer is inserted; S7: forming at least one nanowire vertical to the insulating interlayer, to obtain the (Continued)

nano-scale superconducting quantum interference device. The width of the superconducting ring and the length of the nano junction are determined by the insulating interlayer.

11 Claims, 4 Drawing Sheets

(56) References Cited

U.S. PATENT DOCUMENTS

2001/0023943 A1    9/2001    Zagoskin
2007/0281861 A1    12/2007    Ishimaru et al.

* cited by examiner

NANO-SCALE SUPERCONDUCTING QUANTUM INTERFERENCE DEVICE AND MANUFACTURING METHOD THEREOF

CROSS REFERENCE TO RELATED PATENT APPLICATION

The present application is the US national stage of PCT/CN2014/074880 filed on Apr. 8, 2014, which claims the priority of the Chinese patent application No. 201410035658.6 filed on Jan. 24, 2014, which applications are incorporated herein by reference.

BACKGROUND OF THE PRESENT INVENTION

Field of Invention

The present invention belongs to a field of superconducting electronic technology, and relates to a nano-scale superconducting quantum interference device and a manufacturing method thereof.

Description of Related Arts

The superconducting quantum interference device (SQUID) is an extremely sensitive magnetic sensor by taking advantage of the Josephson effect, which may be used to detect a magnetic field as small as $10^{-15}$ Tesla (equivalent to one multi-billionth of the geomagnetic field), and is one of the most sensitive magnetic sensor by far. A SQUID magnetometer is mainly applied in the fields of physics, chemistry, material science, geology, biology, and medicine, etc., for accurate measurement of various low-intensity magnetic fields, and is of continuing popularity because of its prominent high sensitivity. Nano-scale superconducting quantum interference device (NanoSQUID) is a newly developed device based on the superconducting quantum interference device (SQUID). It takes a nano junction to substitute for a conventional tunnel junction, so that an area of a superconducting ring can be greatly reduced, and a minimum detectable spin number of the device can be correspondingly greatly lowered. Therefore, it improves the sensitivity of the device on a sample ranged from microscopic size to microscopic size. Besides, the device not only endures a relative large critical magnetic field, but also is less susceptible to the disturbance of external magnetic fields because that the area of the superconducting ring is relative small. As a result, there is no need to isolate the device by magnetic shielding. The device can be directly coupled with the sample, and has an outstanding performance in characterizing magnetic properties of the microscopic sample and detecting the small spin ensemble, and has wide application prospects in investigations of biomolecular structures, quantum information, and new material researches, etc.

Currently, the main technology in the world to prepare a nanoSQUID is to directly etch a planar structure of a superconducting ring and a nano junction out of a superconducting thin film by using the electron beam lithography or the focused-ion-beam etching method. The current method is intuitive and simple, but the disadvantages thereof are that: firstly, the size of the nanoSQUID is limited by the electron beam lithography or the focused-ion-beam. Currently, the superconducting ring features a minimum diameter of about 50 nm. Secondly, the current nano-scale superconducting quantum interference device has a problem that the depth of the critical current-flux modulation curve is relatively small, which has a great gap with that of the conventional SQUID. The main reason is that the superconducting material with a higher critical temperature usually has a much shorter coherence length. Thus the length of the nano junction is difficult to be made short enough to be comparable to the coherence length; Another reason is that the nano-junction and the superconducting ring are fabricated along with a same superconducting thin film, thus the thickness of the superconducting ring is limited by the nano junction and leads to a large inductance of the device.

Therefore, it is necessary to provide a manufacturing method of a nano-scale superconducting quantum interference device, to solve the problems in the art that the length of the nano junction is much longer than its coherence length, and the thickness of the superconducting ring is limited by the nano-junction.

SUMMARY OF THE PRESENT INVENTION

In view of the above disadvantages in the prior art, the object of the present invention is to provide a nano-scale superconducting quantum interference device and a manufacturing method thereof, to solve the problems in the art that the length of the nano junction fails to be correspond with its coherence length, and the thickness of the superconducting ring is limited by the nano junction, thereby lowering the device performance.

In order to achieve the above object and other related objects, the present invention provides a manufacturing method of a nano-scale superconducting quantum interference device, at least comprising the following steps of:

S1: providing a substrate, and growing a first superconducting material layer thereon;

S2: forming a photo-resist layer on a surface of the first superconducting material layer, and patterning the photo-resist layer, to expose the surface of the first superconducting material layer in a predetermined region;

S3: etching the first superconducting material layer in the predetermined region, to expose the substrate, and to reserve remaining photo-resist layer;

S4: covering a layer of insulation material on a top and a side of a structure obtained in step S3;

S5: growing a second superconducting material layer on the insulation material, such that an upper surface of the second superconducting material layer in the predetermined region is flush with an upper surface of the first superconducting material layer;

S6: removing the structure above the plane at which the upper surface of the first superconducting material layer locates, to obtain a plane superconducting structure, in the middle of which at least one insulating interlayer is inserted;

S7: on a surface of the plane superconducting structure, forming at least one nanowire vertical to the insulating interlayer and connecting the first superconducting material layer with the second superconducting material layer, so as to form two nano junctions in parallel, to obtain the nano-scale superconducting quantum interference device.

Alternately, in step S3, after etching the first superconducting material layer in the predetermined region to expose the substrate, a further over etching is performed to form a recess region in the substrate; in step S4, the part of the insulation material located in the recess region exactly fills the recess region.

Alternately, the thickness of the insulating interlayer is ranged from 1 nm to 10 nm.

Alternately, a material of the substrate is selected from at least one of MgO, sapphire, $Si_3N_4$, $Al_2O_3$ and $SiO_2$.

Alternately, materials of the first superconducting material layer and the second superconducting material layer are selected from at least one of Nb (niobium), NbN (niobium nitride), NbTi (niobium-titanium) and NbTiN (niobium-titanium-niobium).

The present invention further provides a nano-scale superconducting quantum interference device, at least comprising a plane superconducting structure and at least one nanowire formed on a surface of the plane superconducting structure, the plane superconducting structure comprises a substrate, a first superconducting material layer and a second superconducting material layer formed on the substrate separately; an insulating interlayer is formed between the first superconducting material layer and the second superconducting material layer; an insulation material is formed between the second superconducting material layer and the substrate; the nanowire is vertical to the insulating interlayer and connects the first superconducting material layer with the second superconducting material layer.

Alternately, the device comprises an insulating interlayer and two nanowires vertical to the insulating interlayer; the first superconducting material layer and the second superconducting material layer are respectively formed at two sides of the insulating interlayer and are connected by the nanowires.

Alternately, the device comprises an insulating interlayer and two nanowires vertical to the insulating interlayer; the first superconducting material layer and the second superconducting material layer are respectively formed at two sides of the insulating interlayer and are connected by the nanowires; the region between the two nanowires of the device is formed with a groove or channel; the groove or channel digging through the insulating interlayer, and penetrates the first superconducting material layer and the second superconducting material layer.

Alternately, the device comprises two insulating interlayers and one nanowire vertical to the insulating interlayer; one end of the first superconducting material layer is formed between the two insulating interlayers, and the other end extends outwardly; the second superconducting material layer has a U-shaped portion, and a rear portion formed at a closing end of the U-shaped portion; open flanking end portions of the U-shaped portion are respectively located at the outer side of the two insulating interlayers, a groove or channel is formed between the end portion of the first superconducting material layer located between the two insulating interlayers and the closing end of the U-shaped portion of the second superconducting material layer; the groove or channel penetrates the first superconducting material layer and the second superconducting material layer.

Alternately, the device comprises two insulating interlayers and one nanowire vertical to the insulating interlayer; the first superconducting material layer is formed between the two insulating interlayers; the second superconducting material layer is a rectangular loop, a pair of sides of the rectangular circuit loop are respectively located at the outer sides of the two insulating interlayers, and another pair of sides respectively form a groove or channel with the first superconducting material layer; the groove or channel penetrates the first superconducting material layer and the second superconducting material layer.

Alternately, the thickness of the insulating interlayer is ranged from 1 nm to 10 nm.

From the above, the nano-scale-superconducting quantum interference device and the manufacturing method thereof provided in the present invention, have the following beneficial effects: in the present invention, when manufacturing the nano-scale superconducting quantum interference device, the superconducting ring and the nano junction are respectively achieved by two main different steps. As for the nano-scale superconducting quantum interference device manufactured by the present invention, a space between the first superconducting material layer and the second superconducting material layer is determined by the inserted insulating interlayer, and its width is controllable at the atomic scale, which may be up to 1~10 nm. Another feature is to separately generate a superconducting nanowire vertical to an insulating gap by using the electron beam lithography, so as to form the nanoSQUID on the original superconducting structure, wherein, the length and width of the nano junction are respectively determined by the thickness of the vertical insulating interlayer and the width of the nanowire, and the minimum width and length of the superconducting ring are respectively determined by the width of the insulating interlayer and spacing between the nanowires. In the present invention, the objects that the length of the nano junction is smaller than the coherence length of the superconducting material, and the size of the superconducting ring is greatly reduced may be achieved simultaneously, which further decreases the minimum detectable spin number of the device. The structure generated by using the electron beam lithography is simple, and is easy to achieve the limit width of such technology, besides, the width of the nano junction of the prepared nanoSQUID is less than that of the prior art, which helps to decrease the critical current of the nanoSQUID.

Figure 1:
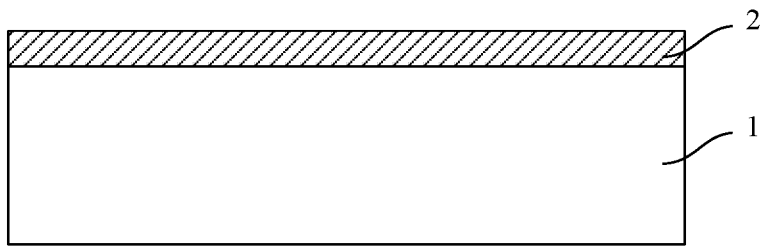
FIG. 1 is a schematic, cross-sectional diagram showing a growth of a first superconducting material layer on a substrate in the manufacturing method of the nano-scale superconducting quantum interference device of the present invention.

ILLUSTRATIONS OF REFERENCE SIGNS 1 substrate
2 first superconducting material layer
3 photo-resist layer
4 insulation material
5 second superconducting material layer
6 insulating interlayer
7 nanowire
8 channel
d thickness of the insulating interlayer

DETAILED DESCRIPTION OF THE PREFERRED EMBODIMENTS

The embodiment modes of the present invention are described hereunder through specific examples, and persons skilled in the art may easily understand other advantages and efficacies of the present invention from the contents disclosed in the present description. The present invention may be further implemented or applied through other different specific embodiment modes, and various modifications or amendments may also be made to each of the details in the present description based on different perspectives and applications without departing from the spirit of the present invention.

Please refer to FIG. 1 to FIG. 14. It is to be noted that the drawings provided in the present embodiment only explain the basic conception of the present invention in an illustrative manner, so the drawings only display the components relevant to the present invention rather than being drawn according to the number, shape and size of the components during actual implementation, the shape, number and scale of each component may be randomly changed during its actual implementation, and the layout of the components thereof might also be more complicated.

The present invention provides a manufacturing method of a nano-scale superconducting quantum interference device, at least comprising the following steps of:

S1: providing a substrate, and growing a first superconducting material layer thereon;

S2: forming a photo-resist layer on a surface of the first superconducting material layer, and patterning the photo-resist layer, to expose the surface of the first superconducting material layer in a predetermined region;

S3: etching the first superconducting material layer in a predetermined region, to expose the substrate, and to reserve remaining photo-resist;

S4: covering a layer of insulation material on a top and a side of a structure obtained in step S3;

S5: growing a second superconducting material layer on the insulation material, such that an upper surface of the second superconducting material layer in the predetermined region is flush with an upper surface of the first superconducting material layer;

S6: removing the structure above the plane at which the upper surface of the first superconducting material layer locates, to obtain a plane superconducting structure, in the middle of which at least one insulating interlayer is inserted;

S7: on a surface of the plane superconducting structure, forming at least one nanowire vertical to the insulating interlayer and connecting the first superconducting material layer with the second superconducting material layer, so as to form two nano junctions in parallel, to obtain the nano-scale superconducting quantum interference device.

The present invention further provides a nano-scale superconducting quantum interference device, at least comprising a plane superconducting structure and at least one nanowire formed on a surface of the plane superconducting structure, the plane superconducting structure comprises a substrate, a first superconducting material layer and a second superconducting material layer formed on the substrate separately; an insulating interlayer is formed between the first superconducting material layer and the second superconducting material layer; an insulation material is formed between the second superconducting material layer and the substrate; the nanowire is vertical to the insulating interlayer and connects the first superconducting material layer with the second superconducting material layer, so as to form two nano junction in parallel.

First Embodiment

The present invention provides a manufacturing method of a nano-scale superconducting quantum interference device, firstly refer to FIG. 1, perform step S1: providing a substrate 1, and growing a first superconducting material layer 2 on the substrate 1.

Specifically, a material of the substrate 1 is selected from at least one of MgO, sapphire, $Si_3N_4$, $Al_2O_3$ and $SiO_2$, or other material which allows a superconducting thin film to grow on. In the present embodiment, the substrate 1 is preferably a MgO substrate.

The meterail of the first superconducting material layer 2 is selected from at least one of Nb, NbN, NbTi and NbTiN, or other superconducting materials. The thickness of the first superconducting material layer is ranged from 10 nm to 200 nm. In the present embodiment, preferably, the substrate 1 is grown with a NbN layer of 50 nm by using the magnetron sputtering method.

Figure 2:
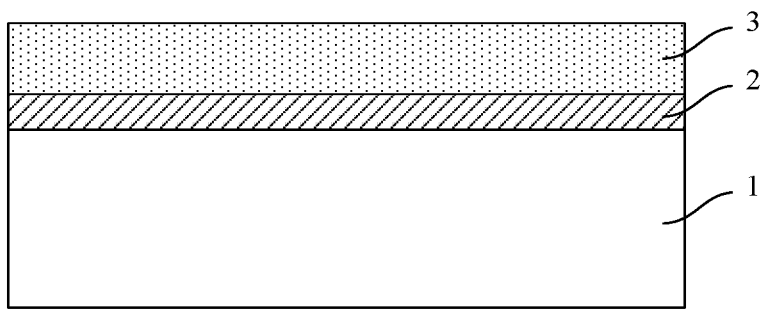
FIG. 2 is a schematic diagram showing a formation of a photo-resist layer in the manufacturing method of the nano-scale superconducting quantum interference device of the present invention.
Figure 3:
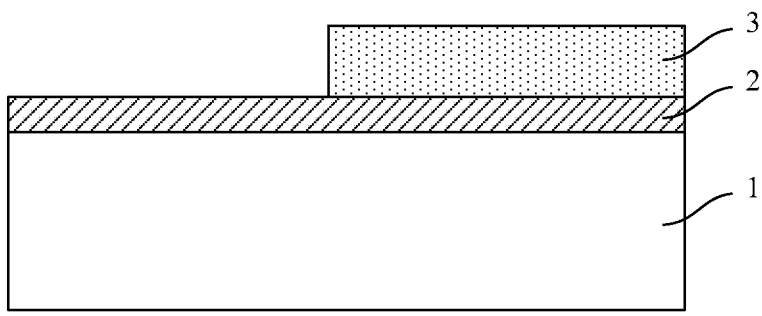
FIG. 3 is a schematic diagram showing a patterning of the photo-resist layer in the manufacturing method of the nano-scale superconducting quantum interference device of the present invention.

Please refer to FIGS. 2 and 3, perform step S2: spin coating a photo-resist layer 3 with a thickness of 200~1000 nm on a surface of the first superconducting material layer 2, and patterning the photo-resist layer 3 by UV exposure and development, to expose the surface of the first superconducting material layer 2 in a predetermined region.

As an example, the photo-resist layer 3 has a thickness of 200 nm, a rectangular graphic mask with a line width of 2 microns is adopted to perform the UV exposure, and further development to pattern the photo-resist layer 3. In the present embodiment, a left side of the substrate is taken as the predetermined region as an example, as shown in FIG. 3. However, it should be noted that, according to different sizes and different functions of the nanoSQUID device to be prepared, the lithographic pattern herein may be changed accordingly, i.e., the pattern in the predetermined region may be changed as well. The above herein is by way of example only, and is not intended to excessively limit the scope of the invention.

Figure 4:
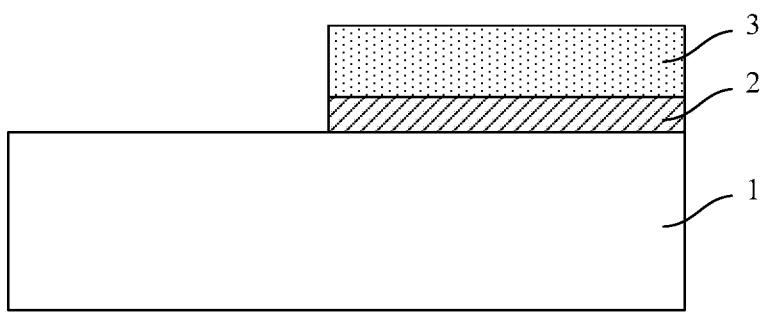
FIG. 4 is a schematic diagram showing an etching of the first superconducting material layer in the manufacturing method of the nano-scale superconducting quantum interference device of the present invention.

Please refer to FIG. 4, perform step S3: etching the first superconducting material layer 2 in the predetermined region, i.e, removing the first superconducting material layer that is not covered by the photo-resist, to expose the substrate 1, and to reserve remaining photo-resist.

Figure 5:
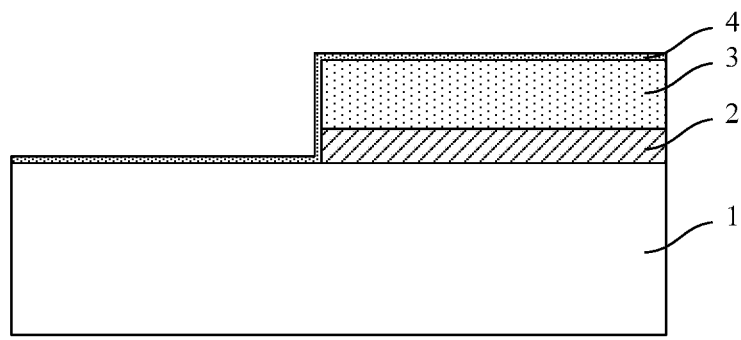
FIG. 5 is a schematic diagram showing a covering of an insulation material in the manufacturing method of the nano-scale superconducting quantum interference device of the present invention.

Please refer to FIG. 5, perform step S4: covering a layer of insulation material 4 on a top and a side of a structure obtained in step S3.

Specifically, reserving the photo-resist, and growing an insulation material with a thickness of 1~10 nm on the top and side of the structure as shown in FIG. 4 by taking advantage of the isotropic characteristics of the magnetron sputtering growth method. As shown in FIG. 5, an upper surface of the exposed portion of the substrate 1 and an upper surface of the photo-resist layer 3 are formed with insulation material 4, the first superconducting material layer 2 and a side of the photo-resist layer 3 are also formed with insulation material 4. In the present embodiment, as an example, the insulation material is MgO with a thickness of 5 nm, and in other embodiments, the insulation material may also be $Si_3N_4$, $Al_2O_3$, $SiO_2$, and the like.

Figure 6:
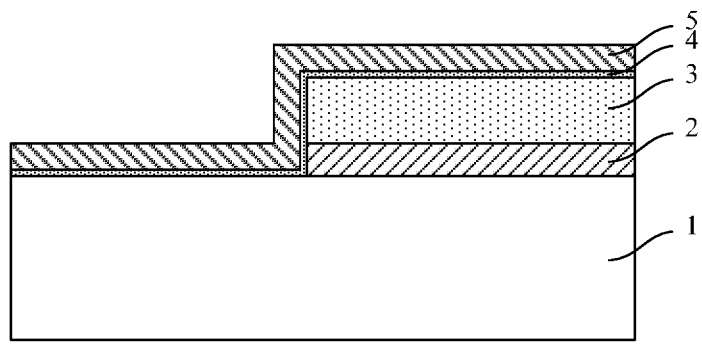
FIG. 6 is a schematic diagram showing a growth of a second superconducting material layer in the manufacturing method of the nano-scale superconducting quantum interference device of the present invention.

Please refer to FIG. 6, perform step S5: growing a second superconducting material layer 5 on the insulation material 4, such that an upper surface of the second superconducting material layer 5 in the predetermined region is flush with an upper surface of the first superconducting material layer 2.

Specifically, the material of the second superconducting material layer 5 is same to that of the first superconducting material layer 2, and the thickness thereof equals to thickness of the first superconducting material layer 2 minus the thickness of the insulation material 4, such that the upper surface of the second superconducting material layer 5 in the predetermined region is flush with the upper surface of the first superconducting material layer 2. In the present embodiment, as an example, the second superconducting material layer 5 is NbN with a thickness of 45 nm.

Figure 7:
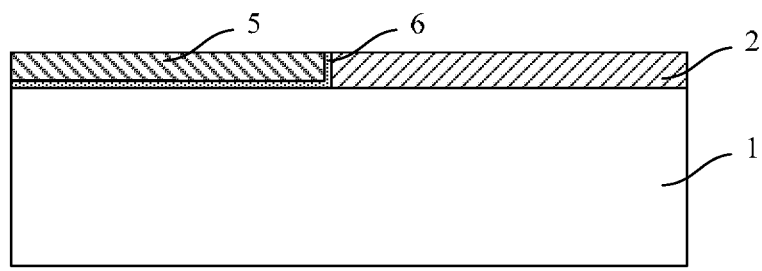
FIG. 7 is a schematic diagram showing a formation of a plane superconducting structure in the manufacturing method of the nano-scale superconducting quantum interference device of the present invention.

Please refer to FIG. 7, perform step S6: stripping the photo-resist layer 3 to remove the structure above the plane where the upper surface of the first superconducting material layer 2 locates, to obtain a plane superconducting structure, in the middle of which at least one insulating interlayer 6 is inserted.

As shown in FIG. 7, in the plane superconducting structure, the insulation material 4 is formed between the second superconducting material layer 5 and the substrate, while the insulation material between the first superconducting material layer 2 and the second superconducting material layer 5 serves as an insulating interlayer 6.

Figure 8:
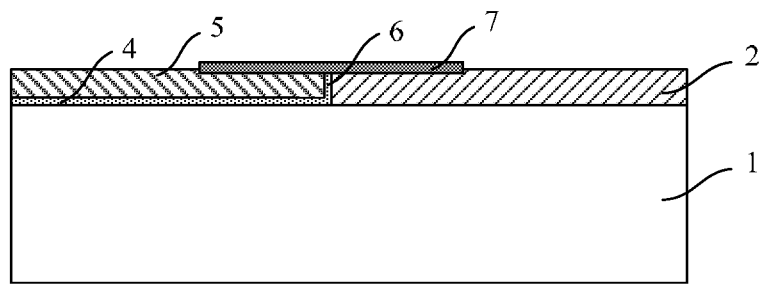
FIG. 8 is schematic, cross-sectional diagram of the nano-scale superconducting quantum interference device the present invention.
Figure 9:
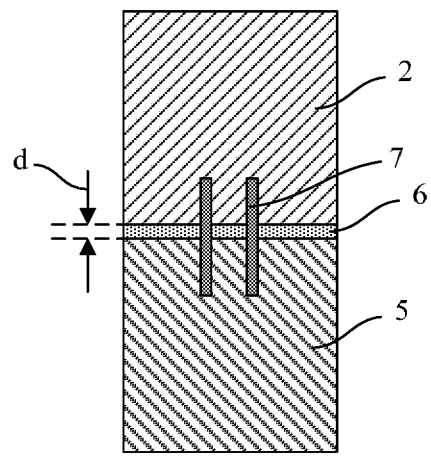
FIG. 9 is a top view of the structure shown in FIG. 8.

Please refer to FIGS. 8 and 9, perform step S7: spin coating electron beam photo-resist on the surface of the plane superconducting structure; electron beam lithographing a nanowire pattern and developing; growing a superconducting thin film; on a surface of the plane superconducting structure, forming at least one nanowire 6 vertical to the insulating interlayer 6 and connecting the first superconducting material layer 2 with the second superconducting material layer 5, so as to form two nano junction in parallel; afterwards, stripping the electron beam photo-resist, to obtain the nano-scale superconducting quantum interference device.

As an example, spin coating electron beam photo-resist on the surface of the plane superconducting structure; electron beam lithographing a nanowire pattern having two parallel wires with a space of 10 nm and a width of 10 nm, and developing; growing a NbN superconducting film of 10 nm; afterwards, stripping the electron beam photo-resist, to form a nanoSQUID with a superconducting ring area of 50 $nm^2$. In other embodiments, the distance between the two nanowires may be further shortened, to obtain a smaller superconducting ring area.

It should be noted that, the abovementioned nano junction refers to the superconducting thin film in the region overlapped by the nanowire and the insulating interlayer, and its length and width are respectively determined by the thickness of the insulating interlayer and the width of the nanowire; the superconducting ring refers to the region surrounded by the two nano-junctions, the first superconducting layer and the second superconducting layer, and its minimum width and length are respectively determined by the space of the nanowires and the thickness of the insulating interlayer.

FIG. 8 is a schematic, cross-sectional diagram of the nano-scale superconducting quantum interference device, and FIG. 9 is a top view of the structure. Wherein, FIG. 9 shows the thickness d of the insulating interlayer. In the present embodiment, the surface of the plane superconducting structure is formed with two nanowires 6, so as to form two nano junctions in parallel, to form the nanoSQUID.

In the manufacturing method of the nano-scale superconducting quantum interference device of the present invention, the length of the nano junction and the width of the superconducting ring are determined by the growth thickness of the insulation material, and the size thereof are controllable at the atomic thickness scale, the objects that the length of the nano junction is smaller than the coherence length of the superconducting material, and the size of the superconducting ring is greatly reduced can be achieved simultaneously. On the other hand, the superconducting ring and the nano junction are respectively achieved by two main steps, which may separate the thickness of superconducting ring and the thickness of nano-junction, increase the thickness of the superconducting material at two ends of the nano junction, eliminate the phase gradient diffusion of superconducting current in the region besides the nano-junction, thereby increasing the modulation depth of the device.

The present invention further provides a nano-scale superconducting quantum interference device. Please refer to FIG. 8, it is shown to a schematic, cross-sectional diagram of the device; as shown in the figure, the device at least comprises a plane superconducting structure and at least one nanowire 7 formed on a surface of the plane superconducting structure, the plane superconducting structure comprises a substrate 1, a first superconducting material layer 2 and a second superconducting material layer 5 formed on the substrate separately; an insulating interlayer 6 is formed between the first superconducting material layer 2 and the second superconducting material layer 5; insulation material 4 is formed between the second superconducting material layer 5 and the substrate 1; the nanowire 7 is vertical to the insulating interlayer 6 and connects the first superconducting material layer 2 with the second superconducting material layer 5.

In the present embodiment, the device comprises an insulating interlayer 6 and two nanowires 7 vertical to the insulating interlayer 6; please refer to FIG. 9, it is shown to a top view of the device; as shown in figure, the first superconducting material layer 2 and the second superconducting material layer 5 are respectively formed at two sides of the insulating interlayer 6 and are connected by the nanowire 7.

Specifically, the thickness of the insulating interlayer 6 is ranged from 1 nm to 10 nm, in the present embodiment, preferably, 5 nm (i.e., a coherence length of the NbN thin film).

In the nano-scale superconducting quantum interference device of the present invention, the line width of the nano junction is relative small (1~10 nm), which is less than the coherence length of the superconducting material, and may help to decrease the critical current of the nanoSQUID; moreover, the thickness of the superconducting ring is not limited by the nano junction, as a result, it may eliminate the phase gradient diffusion of superconducting current in the region besides the nano junction by increasing the thickness of the superconducting material at two ends of the nano junction, thereby increasing the modulation depth of the device.

Second Embodiment

The first embodiment has provided a specific implementation manner of the nano-scale superconducting quantum interference device and the manufacturing method thereof of the present invention, however, according to different sizes and different functions of the device, the device may adopt other graphic designs, and the corresponding manufacturing method may be slightly adjusted.

Figure 10:
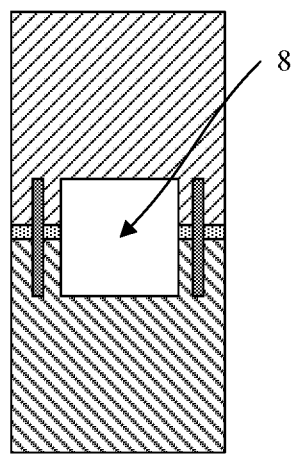
FIG. 10 is a top view of the nano-scale superconducting quantum interference device in a second embodiment of the present invention.

Please refer to FIG. 10, in view of the manufacturing method of the nano-scale superconducting quantum interference device in the first embodiment, the present embodiment further forms a groove or channel in the region between the two nanowires; the groove or channel digs through the insulating interlayer and penetrates the first superconducting material layer and the second superconducting material layer. FIG. 10 is a top view of the device structure obtained in the present embodiment, wherein, the channel 8 is shown, which penetrates the superconducting material layer and the substrate 1. The channel 8 may also be replaced by a groove, which penetrates the superconducting material layer but not the substrate. The object of providing the channel or groove is to increase the area of the superconducting ring according to requirements of the device designs.

In the present embodiment, the nano-scale superconducting quantum interference device comprises an insulating interlayer and two nanowires vertical to the insulating interlayer; the first superconducting material layer and the second superconducting material layer are respectively formed at two sides of the insulating interlayer and are connected by the nanowires; the region between the two nanowires of the device is formed with a groove or channel; the groove or channel digs through the insulating interlayer and penetrates the first superconducting material layer and the second superconducting material layer. The thickness of the insulating interlayer is ranged from 1 nm to 10 nm.

Third Embodiment

The approach adopted in the present embodiment is basically same to that in the first embodiment, and is different in that: in step S3, etching the first superconducting material layer in the predetermined region and exposing the substrate; after that, further performing proper over etching to form a recess region in the substrate; in step S4, the part of the insulation material located in the recess region exactly fills the recess region.

Figure 11:
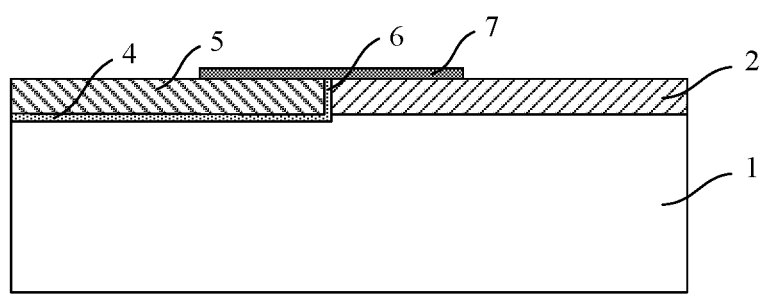
FIG. 11 is a schematic, cross-sectional diagram of the nano-scale superconducting quantum interference device in a third embodiment of the present invention.

Please refer to FIG. 11, it is shown to a schematic, cross-sectional diagram of the nano-scale superconducting quantum interference device formed in the present embodiment. With respect to the first embodiment, the nano-scale superconducting quantum interference device in the present embodiment has the advantages in that: the first superconducting material layer 2 has a same thickness to the second superconducting material layer 3, which makes the device more symmetrical, while the insulation material 4 between the second superconducting material layer 2 and the substrate 1 serves as a portion of the substrate, which has no harmful impact on the device.

Fourth Embodiment

The approach adopted in the present embodiment is basically same to that in the first embodiment, and is different in that: the nano-scale superconducting quantum interference device formed in the first embodiment only has one insulating interlayer, while the nano-scale superconducting quantum interference device formed in the present embodiment has two insulating interlayers and a nanowire vertical to the insulating interlayer. During manufacturing, it may be achieved by the basically same method in the first embodiment by changing the graphic design.

Specifically, in the first embodiment, the predetermined region is one side of the substrate, while in the present embodiment, the predetermined region is two sides of the substrate.

Figure 12:
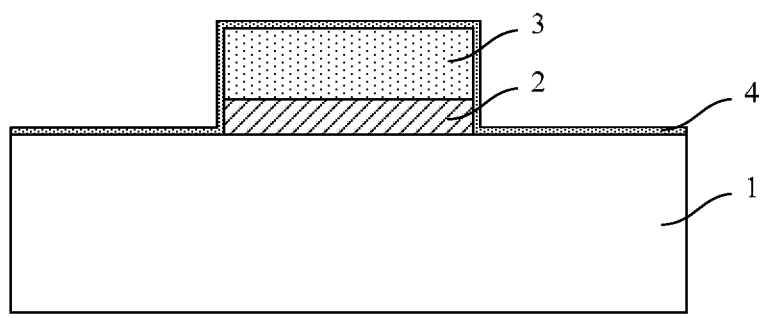
FIG. 12 is a schematic, cross-sectional diagram of a structure obtained in step S4 of the nano-scale superconducting quantum interference device in a fourth embodiment of the present invention.

Please refer to FIG. 12, it is shown to a sectional diagram of the structure obtain in step S4 of the present embodiment; as shown in the figure, the region at two sides of the first superconducting material layer 2 is removed, so as to form a portion of the insulation material 4 at two sides of the middle first superconducting material layer 2; by subsequently forming the second superconducting material layer and stripping the photo-resist, a nano-scale superconducting quantum interference device with two insulating interlayers can be obtained.

Figure 13:
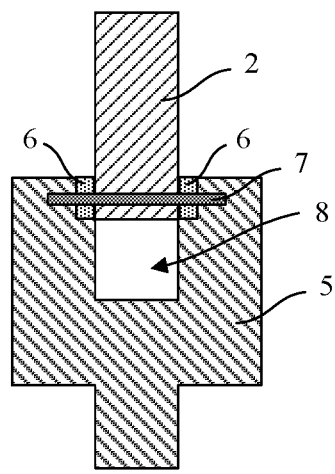
FIG. 13 is a top view of the nano-scale superconducting quantum interference device in the fourth embodiment of the present invention.
Figure 14:
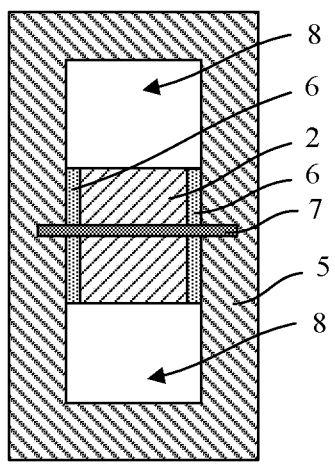
FIG. 14 is a top view of the nano-scale superconducting quantum interference device in a fifth embodiment of the present invention.

Please refer to FIG. 13, it is shown to a top view of the nano-scale superconducting quantum interference device finally obtained in the present embodiment. The device comprises two insulating interlayers and one nanowire 7 vertical to the insulating interlayer 6; one end of the first superconducting material layer 2 is formed between the two insulating interlayers, and the other end extends outwardly; the second superconducting material layer 5 has a U-shaped portion, and a rear portion formed at a closing end of the U-shaped portion; open flanking end portions of the U-shaped portion are respectively located at the outer side of the two insulating interlayers, a groove or channel 8 is formed between the end portion of the first superconducting material layer 2 located between the two insulating interlayers and the closing end of the U-shaped portion of the second superconducting material layer 5; the groove or channel penetrates the first superconducting material layer 2 and the second superconducting material layer 5. The thickness of the insulating interlayer is ranged from 1 nm to 10 nm.

Comparing to the first embodiment, the nano-scale superconducting quantum interference device in the present embodiment has the following advantages: the device in the first embodiment comprises two nanowires, and is not easy to maintain consistency of the line width during the formation, with the result that the two nano-junctions are apt to have different sizes, and the device performance is influenced as well; while in the present embodiment, the device just comprises one nanowire with a consistent line width, so that the two nano junctions are the same size.

Fifth Embodiment

The approach adopted in the present embodiment is basically same to that in the fourth embodiment, and is different in the graphic design. The nano-scale superconducting quantum interference device formed in the present embodiment may be used as a gradiometer for avoiding background magnetic field interference. Please refer to FIG. 14, it is shown to a top view of the nano-scale superconducting quantum interference device formed in the present embodiment. As shown in figure, The device comprises two insulating interlayers and one nanowire 7 vertical to the insulating interlayer 6; the first superconducting material layer 2 is formed between the two insulating interlayers. The second superconducting material layer 5 is a rectangular ring, a pair of sides of the rectangular circuit loop are respectively located at the outer sides of the two insulating interlayers 6, and another pair of sides respectively form a groove or channel 8 with the first superconducting material layer 2; the groove or channel penetrates the first superconducting material layer 2 and the second superconducting material layer 5. The thickness of the insulating interlayer is ranged from 1 nm to 10 nm.

From the above, in the present invention, when manufacturing the nano-scale superconducting quantum interference device, the superconducting ring and the nano junction are respectively achieved by two main steps. As for the nano-scale superconducting quantum interference device manufactured by the present invention, a space between the first superconducting material layer and the second superconducting material layer is determined by the inserted insulating interlayer, and its width is controllable at the atomic scale, which may be up to 1~10 nm. Another feature is to separately generate a superconducting nanowire vertical to an insulating gap by using the electron beam lithography, so as to form the nanoSQUID on the original superconducting structure, wherein the thickness of the insulating interlayer simultaneously determines the width of the superconducting loop (superconducting ring) and the length of the nano junction, while the line width of the nanowire and the space between two nanowires also simultaneously determine the width of the nano junction and the length of the superconducting loop. In the present invention, the objects that the length of the nano junction is smaller than the coherence length of the superconducting material, and the size of the superconducting ring is greatly reduced may be achieved simultaneously, and the sensitivity of the device on a small amount of spins can be increased. The structure generated by using the electron beam lithography is simple, and is easy to achieve the limit width of such technology; besides, the width of the nano junction of the prepared nanoSQUID is less than that of the prior art, which helps to decrease the critical current of the nanoSQUID. Therefore, the present invention effectively overcomes a variety of disadvantages in the prior art and has high industrial utility value.

The abovementioned embodiments only illustratively describe the principle and efficacy of the present invention, rather than being used to limit the present invention. Any person skilled in the art may modify or amend the abovementioned embodiments without departing from the spirit and scope of the present invention. Thus, all equivalent modifications or amendments accomplished by persons having common knowledge in the technical field concerned without departing from the spirit and technical thoughts revealed by the present invention shall still be covered by the claims of the present invention.

What is claimed is:

1. A manufacturing method of a nano-scale superconducting quantum interference device, at least comprising the following steps of:

S1: providing a substrate, and growing a first superconducting material layer thereon;

S2: forming a photo-resist layer on a surface of the first superconducting material layer, and patterning the photo-resist layer, to expose the surface of the first superconducting material layer in a predetermined region;

S3: etching the first superconducting material layer in the predetermined region, to expose the substrate, and to reserve remaining photo-resist;

S4: covering a layer of insulation material on a top and a side of a structure obtained in step S3;

S5: growing a second superconducting material layer on the insulation material, such that an upper surface of the second superconducting material layer in the predetermined region is flush with an upper surface of the first superconducting material layer;

S6: removing the structure above the plane where the upper surface of the first superconducting material layer locates, to obtain a plane superconducting structure, in the middle of which at least one insulating interlayer is inserted;

S7: on a surface of the plane superconducting structure, forming at least one nanowire vertical to the insulating interlayer and connecting the first superconducting material layer with the second superconducting material layer, so as to form two nano-junctions in parallel, to obtain the nano-scale superconducting quantum interference device.

2. The manufacturing method of the nano-scale superconducting quantum interference device according to claim 1, characterized in that: in step S3, after etching the first superconducting material layer in the predetermined region to expose the substrate, a further over etching is performed to form a recess region in the substrate; in step S4, the part of the insulation material located in the recess region exactly fills the recess region.

3. The manufacturing method of the nano-scale superconducting quantum interference device according to claim 1, characterized in that: the thickness of the insulating interlayer is ranged from 1 nm to 10 nm.

4. The manufacturing method of the nano-scale superconducting quantum interference device according to claim 1, characterized in that: a material of the substrate is selected from at least one of MgO, sapphire, $Si_3N_4$, $Al_2O_3$ and $SiO_2$.

5. The manufacturing method of the nano-scale superconducting quantum interference device according to claim 1, characterized in that: materials of the first superconducting material layer and the second superconducting material layer are selected from at least one of Nb, NbN, NbTi and NbTiN.

6. A nano-scale superconducting quantum interference device, at least comprising a plane superconducting structure and at least one nanowire formed on a surface of the plane superconducting structure, characterized in that:

the plane superconducting structure comprises a substrate, a first superconducting material layer and a second superconducting material layer formed on the substrate separately;

an insulating interlayer is formed between the first superconducting material layer and the second superconducting material layer; an insulation material is formed between the second superconducting material layer and the substrate;

the nanowire is vertical to the insulating interlayer and connects the first superconducting material layer with the second superconducting material layer, so as to form two nano-junctions in parallel.

7. The nano-scale superconducting quantum interference device according to claim 6, characterized in that: the device comprises an insulating interlayer and two nanowires vertical to the insulating interlayer; the first superconducting material layer and the second superconducting material layer are respectively formed at two sides of the insulating interlayer and are connected by the nanowires.

8. The nano-scale superconducting quantum interference device according to claim 6, characterized in that: the device comprises an insulating interlayer and two nanowires vertical to the insulating interlayer; the first superconducting material layer and the second superconducting material layer are respectively formed at two sides of the insulating interlayer and are connected by the nanowires; the region between the two nanowires of the device is formed with a groove or channel; the groove or channel digs through the insulating interlayer, and penetrates the first superconducting material layer and the second superconducting material layer.

9. The nano-scale superconducting quantum interference device according to claim 6, characterized in that: the device comprises two insulating interlayers and one nanowire vertical to the insulating interlayer; one end of the first superconducting material layer is formed between the two insulating interlayers, and the other end extends outwardly; the second superconducting material layer has a U-shaped portion, and a rear portion formed at a closing end of the U-shaped portion; open flanking end portions of the U-shaped portion are respectively located at the outer side of the two insulating interlayers, a groove or channel is formed between the end portion of the first superconducting material layer located between the two insulating interlayers and the closing end of the U-shaped portion of the second superconducting material layer; the groove or channel penetrates the first superconducting material layer and the second superconducting material layer.

10. The nano-scale superconducting quantum interference device according to claim 6, characterized in that: the device comprises two insulating interlayers and one nanowire vertical to the insulating interlayer; the first superconducting material layer is formed between the two insulating interlayers; the second superconducting material layer is a rectangular circuit loop, a pair of sides of the rectangular circuit loop are respectively located at the outer sides of the two insulating interlayers, and another pair of sides respectively form a groove or channel with the first superconducting material layer; the groove or channel penetrates the first superconducting material layer and the second superconducting material layer.

11. The nano-scale superconducting quantum interference device according to claim 6, characterized in that: the thickness of the insulating interlayer is ranged from 1 nm to 10 nm.

* * * * *